United States Patent [19]
Orito

[11] Patent Number: 4,483,736
[45] Date of Patent: Nov. 20, 1984

[54] METHOD FOR PRODUCING A SINGLE CRYSTAL OF A $III_b$-$V_b$ COMPOUND

[75] Inventor: Fumio Orito, Tsuchiura, Japan

[73] Assignee: Mitsubishi Monsanto Chemical Co., Ltd., Tokyo, Japan

[21] Appl. No.: 359,204

[22] Filed: Mar. 18, 1982

[30] Foreign Application Priority Data

Mar. 24, 1981 [JP] Japan ................... 56-42999
Mar. 24, 1981 [JP] Japan ................... 56-43000

[51] Int. Cl.³ ............................................. C30B 13/32
[52] U.S. Cl. ........................ 156/616 A; 156/DIG. 70
[58] Field of Search .................. 156/610, 611, 616 A, 156/624, DIG. 70, DIG. 73, DIG. 81

[56] References Cited
U.S. PATENT DOCUMENTS

| | | | |
|---|---|---|---|
| 3,168,423 | 2/1965 | Krieglestein et al. | 156/610 |
| 3,729,348 | 4/1973 | Saul | 156/624 |
| 3,893,876 | 7/1975 | Akai et al. | 156/DIG. 70 |
| 4,013,501 | 3/1977 | Van Vitert et al. | 156/624 |

FOREIGN PATENT DOCUMENTS

| | | | |
|---|---|---|---|
| 2454110 | 5/1976 | Fed. Rep. of Germany | 156/610 |
| 77170 | 6/1980 | Japan | 156/DIG. 73 |
| 1495800 | 12/1977 | United Kingdom . | |

Primary Examiner—David Lacey
Attorney, Agent, or Firm—Burgess, Ryan & Wayne

[57] ABSTRACT

When the growth of a single crystalline $III_b$-$V_b$ group compound is carried out employing the horizontal Bridgeman method or the gradient freeze method, it is likely that polycrystals will be grown, crystal defects will form, and the distribution of impurities will not be uniform, especially if the diameter of the single crystal is large. In the present invention, the cooling rate of the melt is controlled in an inconstant manner. Namely, crystal growth is interrupted at least once and/or the cooling rate at an earlier growth period is controlled at a high value. From 40 to 65% of the total melt crystallizes at the time when 30% of the total time required for growth has elapsed. The high yield of a single crystal is attained according to the present invention.

4 Claims, 3 Drawing Figures

METHOD FOR PRODUCING A SINGLE CRYSTAL OF A III$_b$-V$_b$ COMPOUND

The present invention relates to a method for producing a single crystal and more particularly to a method for producing a single crystal of an inorganic compound which consists of a III$_b$ group element and a V$_b$ group element of the Periodic Table. Said compound is hereinafter referred to as a III$_b$-V$_b$ group compound.

A single crystal of a III$_b$-V$_b$ group compound, for example GaAs, GaP, and InP, exhibits semiconductor properties and is widely used as an element of opto-electronic devices, such as a light-emitting diode and a semiconductor LASER, as well as an element of ultra-high frequency (UHF) or super highfrequency (SHE) devices, such as a Gunn diode, an IMPATT diode, and a field effect transistor (FET).

In order to carry out the growth of a single crystalline III$_b$-V$_b$ group compound, a growth method in which a boat is used, such as the gradient freeze method (GF method) or the horizontal Bridgeman method (HB method), is employed in the case of most kinds of III$_b$-V$_b$ group compounds except for GaP and InP, which have a high dissociation pressure. The growth method in which a boat is used, hereinafter referred to as the boat growth method, is advantageous for the growth of most kinds of single crystalline III$_b$-V$_b$ group compounds because the diameter of a single crystal can be easily controlled and also the III$_b$-V$_b$ group compounds, which exhibit a volume increase during crystallization, can easily crystallize as a single crystalline III$_b$-V$_b$ group compound. In the HB method, an electric furnace provided with an appropriate temperature gradient is displaced relative to the boat in which the crystal is grown from a melt, thereby displacing the solid-liquid interface of the III$_b$-V$_b$ group compound which is disposed in the boat and crystallizes as a single crystalline III$_b$-V$_b$ group compound. In the GF method, an electric furnace is composed of from approximately 4 to 8 zones which heat the III$_b$-V$_b$ group compound in such a manner that an appropriate temperature gradient is created in the electric furnace. In the HB method the electric furnace is displaced. In the GF method, the electric furnace is not displaced but the temperature is gradually decreased, as is explained in detail with reference to FIG. 1. The GF method is therefore appropriate for the production of a single crystal having a large dimension.

Figure 1:
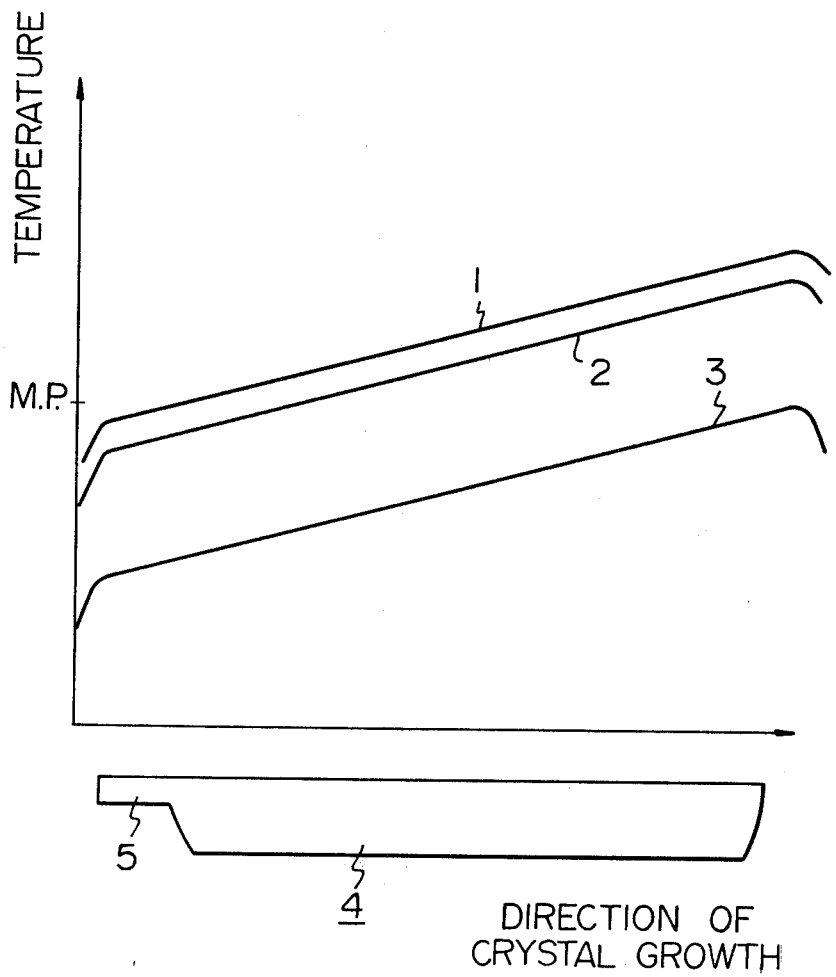
FIG. 1 is a schematic drawing illustrating the temperature gradient and the decrease in temperature according to the GF method.

It will be understood from FIG. 1 how the growth of a single crystalline III$_b$-V$_b$ group compound is carried out by means of the GF method. In the figure, the direction of crystal growth is indicated by the abscissa and the temperature is indicated by the ordinate. As stated hereinabove, the temperature is gradually decreased according to the GF method, which decrease causes the temperature profile to change with the lapse of time, as indicated by the reference numerals 1, 2, and 3. The boat in which the crystal is grown from a melt is denoted by the reference numeral 4. A longitudinal cross section of the boat, which has the same dimension as the temperature profiles 1, 2, and 3, is shown. A seed crystal (not shown) of the III$_b$-V$_b$ group compound is located on the end 5 of the boat 4. In accordance with the change in the temperature profiles in the order of 1, 2, and 3, the solid-liquid interface of the III$_b$-V$_b$ group compound whose melting point is denoted by M.P. is displaced in the direction of crystal growth, with the result that a single crystalline III$_b$-V$_b$ group compound is formed.

Although only the GF method is explained with reference to FIG. 1, it will be understood how the solid-liquid interface is formed and displaced in the HB method, which is different from the GF method regarding the displacement of the electric furnace. The cooling rate of the III$_b$-V$_b$ group compound is determined by the displacement rate of the electric furnace in the case of the HB method. In the boat growth methods, i.e. in the HB and GB methods, the growth of a single crystalline III$_b$-V$_b$ group compound is carried out by maintaining the cooling rate and thus the growth rate of the single crystalline III$_b$-V$_b$ group compound at constant values. The present inventors discovered that when the crystal growth method is carried out at a constant cooling rate, it is difficult to obtain a high yield of a single crystal, especially in the case where the diameter of the single crystal is large, such as 75 mm (3 inches). The reason for this is explained in detail with reference to FIG. 2.

Figure 2:
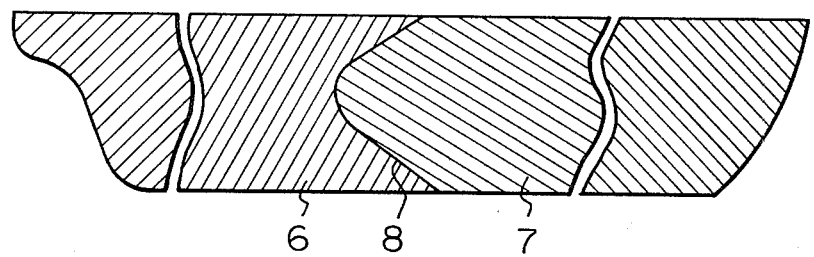
FIG. 2 is a schematic longitudinal cross sectional view of the III$_b$-V$_b$ group compound formed by means of the boat growth method.

In FIG. 2, a solid-liquid interface 8, which is schematically shown, is formed between the solid phase (single crystal phase) 6 and the liquid phase 7. As described hereinabove, the volume of the III$_b$-V$_b$ group compound increases during crystallization, and, in the case of GaAs for example, the density of GaAs changes from 5.71 gram/cm$^3$ (liquid) to 5.16 gram/cm$^3$ (solid) at 1238° C. Since the solid-liquid interface 8 is not flat but is ellipsoidal with a concave solid surface, a high thermal stress is generated at the solid-liquid interface 8, and the relaxation of such high stress causes, in turn, the generation of dislocations. The generation of dislocations tends to result in grain boundaries, which result in polycrystals and the like. When the single crystal to be grown has a large diameter, the radiation of heat from the central part of the single crystal is difficult and therefore the curvature of the ellipsoidal solid-liquid interface tends to be high. Also, the tendency of polycrystals and the like to form is greater if the diameter of the boat in which the crystal is grown from a melt is greater. The yield of a single crystal when the diameter of the boat is 75 mm is only half or less than half of the yield when the diameter of the boat is 50 mm.

Another reason for the low yield of a single crystal produced by the boat growth method at a constant rate is probably the fact that crystal defects are liable to be generated and in turn result in the formation of grain boundaries at the initial crystal growth stage.

It is an object of the present invention to provide a novel method for producing a single crystalline III$_b$-V$_b$ group compound so as to remove the disadvantages of the conventional boat growth method in which a crystal is grown at a constant cooling rate, especially the disadvantageously low yield of a single crystal.

The concept involved in the present invention is to carry out the cooling of a crystal at an inconstant rate.

In accordance with the object of the present invention, there is provided a method for producing a single crystalline III$_b$-V$_b$ group compound, which method involves the use of a boat in which the crystal is grown from a melt, characterized in that said method includes at least one period of interruption of crystal growth. This method is hereinafter referred to as the interruption method.

In accordance with the object of the present invention, there is also provided a method for producing a single crystalline III$_b$-V$_b$ group compound, which method involves the use of a boat in which the crystal is grown from a melt, characterized in that from 40 to 65% of the total melt is crystallized at the time when 30% of the time for crystal growth has elapsed based on the total amount of time required for completing the crystallization of the total melt. This method is hereinafter referred to as the accelerative crystallization method.

In the interruption method, crystal growth is interrupted or the solid-liquid interface is made stationary at least once so that the generation of stress is effectively suppressed. In other words, the interruption method includes: a growth step, in which the solid-liquid interface is displaced in the direction of crystal growth and stress is generated to an appreciable degree, and at least one interruption step, in which no displacement of the solid-liquid interface in the direction of crystal growth takes place, and not only is stress not generated but stress already generated can be effectively eliminated.

In an embodiment of the interruption method, the temperature of the III$_b$-V$_b$ group compound in the boat remains constant over a period of from 1 to 12 hours so as to interrupt crystal growth. When the period of interruption of crystal growth exceeds 12 hours, no serious disadvantages are brought about but the time required for completion of crystal growth is so long that the production efficiency is disadvantageously reduced. When the period of interruption of crystal growth is less than 1 hour, the shape of the solid-liquid interface cannot satisfactorily be flattened. When such period is 30 minutes or less, the solid-liquid interface remains essentially ellipsoidal and is therefore undesirable. Keeping the temperature of the III$_b$-V$_b$ group compound in the boat constant can be realized by interrupting the falling of the temperature profile, as shown in FIG. 1, in the case of the GF method and by interrupting the relative displacement of the electric furnace in the case of the HB method.

In another embodiment of the interruption method, the temperature of the III$_b$-V$_b$ group compound is increased by an amount of from 0.1° to 3° C. so as to interrupt crystal growth. That is, such temperature at each interruption step is from 0.1° to 3° C. higher than such temperature at the end of the preceeding crystal growth step. When the temperature increase exceeds 3° C., remelting of the single crystalline or solid III$_b$-V$_b$ group compound may exceed the degree of remelting which is necessary for flattening the ellipsoidal solid-liquid interface. In addition, the time required for completion of crystal growth becomes disadvantageously long. When the temperature increase is less than 0.5° C., the degree of remelting is not effective for flattening the ellipsoidal solid-liquid interface. The temperature increasing rate may be higher or lower than the rate of decrease in temperature, and the temperature increasing rate may be from approximately 0.1° to 5° C./minute.

In an embodiment of the interruption method, the interruption of crystal growth is carried out in at least two steps, which is more advantageous than carrying it out in one step. When the temperature is kept constant during the interruption of crystal growth, the interval between the successive two interruption steps can be from 3 to 12 hours, and the interruption steps can be from 1 to 2 hours individually and should be less than 12 hours in total. When the temperature is increased during the interruption of crystal growth, it is preferable to repeat the process in which a decrease in temperature of from 5° to 15° C. for crystal growth is followed by an increase in temperature of from 0.1° to 3° C.

In another embodiment of the interruption method, the interruption of crystal growth is carried out in one step by keeping constant the temperature of the III$_b$-V$_b$ group compound in the boat and in another step by increasing the temperature.

Figure 3:
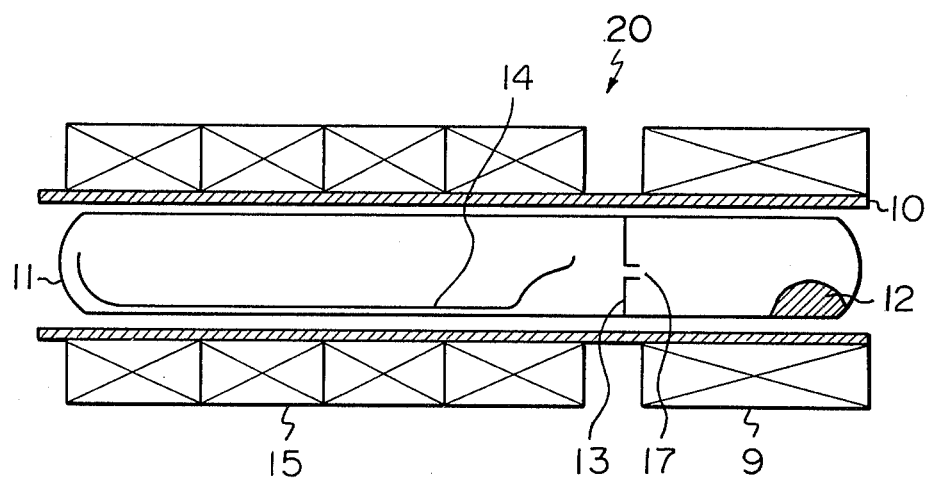
FIG. 3 is a drawing of a growth apparatus for carrying out the GF method.

In the accelerative crystallization method, the crystal growth rate at an earlier stage is higher than at a later stage. When only less than 40% of the total melt has crystallized at a predetermined time, i.e. at the time when 30% of the total amount of time required for crystallization of the total melt has elapsed, the crystal properties are not uniform in the final product and twins are liable to frequently form in the final product. The predetermined time mentioned above is hereinafter referred to as the 30% time. The percentage of the melt which has crystallized at the 30% time, is referred to as the degree of crystallization at the 30% time. When the degree of crystallization at the 30% time is more than 65%, destruction of the quartz ampoule shown in FIG. 3 is likely to occur.

In an embodiment of the accelerative crystallization method, the degree of crystallization at the 30% time is from 50 to 65%, and, in addition, the percentage of the melt which has crystallized at the time when 10% of the total period of time required to complete crystal growth has elapsed is controlled (similarly referred to as the degree of crystallization at the 10% time). The degree of crystallization at the 10% time should be from 20 to 40%. Control of the degree of crystallization at a predetermined time of crystal growth, e.g. the 10% or 30% time, can be realized by controlling the cooling rate of the melt. More specifically, in the HB method, the rate of displacement of the electric furnace at an earlier stage than the predetermined time of crystal growth is controlled at a higher value than that at a later stage. In the GF method, the rate of decrease in the temperature at an earlier stage than the predetermined time of crystal growth is controlled at a higher value than that at a later stage. The appropriate rate of displacement of the electric furnace and the rate of decrease in the temperature depend upon the quantity of the III$_b$-V$_b$ group compound charged into the boat in which the crystal is grown from a melt. In the case where the charged quantity is from 1300 to 1500 grams, the rate of displacement of the electric furnace according to the HB method at said earlier stage is from 8 to 20 mm/hour and preferably from 13 to 20 mm/hour at a stage earlier than the 10% time, while in the GF method the rate of decrease in temperature at said earlier stage is from 1° C./hour to 5° C./hour and preferably from 2.5° C./hour to 5° C./hour at a stage earlier than the 10% time.

In the accelerative crystallization method, a high degree of crystallization at a stage earlier than the predetermined time results in lessening of the undesired effects due to crystallization at said earlier stage, at which stage twins are frequently formed due to wetting of the melt to the surface of the boat. Since the generation of twins can be considerably decreased according to the accelerative crystallization method, the yield of a single crystal can be increased. Furthermore, it is possible to decrease the number of crystal defects at the portion of the crystal having a proximity to the portion where crystal growth is completed, thereby contributing further to the high yield of a single crystal.

The accelerative crystallization method is also more advantageous in regard to a shorter period of growth than are the conventional HB and GF methods. For example, in a case where the period for completing crystal growth amounts to 100 hours in a conventional method, such period can be decreased to approximately 75 hours according to the accelerative crystallization method of the present invention.

The accelerative crystallization method is also advantageous for obtaining uniform distribution of the impurities for determining electric properties, for example the conductivity type and resistivity of a single crystal such as silicon, tellurium, zinc, chromium, and the like, especially chromium, which has a low segregation coefficient. In the case of the accelerative crystallization method, the resistivity of a single crystal composed of, for example, GaAs does not vary greatly in the longitudinal direction or crystal growth direction and therefore the yield of a single crystal is high.

In an embodiment of the present invention, the interruption method and the accelerative crystallization method are used to grow a single crystalline $III_b$-$V_b$ group compound. In this embodiment, crystal growth is preferably carried out by means of the accelerative crystallization method until the 30% time and is then carried out by means of the interruption method.

One of the most significant advantages of the present invention resides in the fact that the yield of a single crystal having a diameter of 75 mm is the same as or comparable to that of a single crystal having a diameter of 50 mm. Since in the electronics industry there is a demand for 75 mm wafers instead of the conventional, so-called 50 mm wafers, the present invention can greatly contribute to the electronics industry.

The present invention will now be explained by way of examples.

EXAMPLE 1

(The Interruption Method)

Single crystalline GaAs was produced by means of a growth apparatus of the GF method as shown in FIG. 3. The electric furnace 20 of the growth apparatus was provided with four separate heating zones 15 for heating the $III_b$-$V_b$ group compound (not shown) and a heating zone 9 for heating arsenic 12. The electric furnace 20 comprised a core tube 10 containing a quartz ampoule 11.

The quartz ampoule 11 was divided into a zone containing the boat 14 in which the crystal was grown from a melt and a zone containing the arsenic 12 by a partition 13 having a capillary tube 17. The arsenic vapor from the arsenic 12 was admitted into said one zone containing the boat 14 at a pressure controlled by the action of the capillary tube 17. The boat 14 had such a dimension that a single crystal having a semicircular cross section, a diameter of 75 mm, and length of 450 mm could be produced.

Crystal growth by means of the interruption method was carried out as follows.

Polycrystalline GaAs in an amount of 4400 grams was charged into the boat 14 and a seed crystal of GaAs having an <111> As orientation was located at the end of the boat 14 on the lefthand side (FIG. 3). At the beginning of crystal growth, the temperature profile was controlled so that: the position of the seed crystal of GaAs was 1230° C., the end of the boat 14 opposite the seed crystal of GaAs was 1280° C., and the temperature of the arsenic 12 was 610° C. When this temperature profile was generated in the core tube 10, the polycrystalline GaAs was caused to melt. Subsequently, the temperature of the $III_b$-$V_b$ group compound, i.e. the polycrystalline GaAs, in the boat 14 was decreased. In other words, the temperature at every point on the temperature profile was decreased while the temperature gradient was maintained, which can be understood from the curves denoted by 1,2, and 3 in FIG. 1. The program for decreasing the temperature of GaAs was as follows.

| Period of Time Since Beginning of Crystal Growth | Rate of Decrease Temperature |
| --- | --- |
| 0~10 hours | 0.7° C./hr |
| 10~20 hours | 0.6° C./hr |
| 20~25 hours | 0.0° C./hr |
| 25~80 hours | 0.5° C./hr |

In the resultant GaAs ingot or rod, the percentage length of a single crystal based on the total length was 35%. This percentage length is hereinafter referred to as the single crystallization ratio.

EXAMPLE 2

(A Comparative Example of the Interruption Method)

The procedure of Example 1 was repeated except that the 5-hour period from 20 to 25 hours when the temperature did not change was not included in the cooling program. The single crystallization ratio was 18%.

EXAMPLE 3

(The Interruption Method)

The procedure of Example 1 was repeated except that the following program of temperature decrease was employed.

| Period of Time Since Beginning of Crystal Growth | Rate of Decrease in Temperature |
| --- | --- |
| 0~10 hours | 0.7° C./hr |
| 10~20 hours | 0.6° C./hr |
| 20~25 hours | 0.0° C./hr |
| 25~35 hours | 0.5° C./hr |
| 35~40 hours | 0.0° C./hr |
| 40~85 hours | 0.5° C./hr |

The single crystallization ratio was 45%.

EXAMPLE 4

(The Interruption Method)

The procedure of Example 1 was repeated except that a 50° C. decrease in temperature was realized by repeating a process comprising a growth step, in which the temperature was decreased at a rate of 0.7° C./hr for a period of 10 hours, and a 1-hour interruption step. The single crystallization ratio was 44%.

EXAMPLE 5

(The Interruption Method)

The procedure of Example 1 was repeated except that a 60° C. decrease in temperature was realized by repeating a process comprising a growth step, in which the temperature was decreased at a rate of 0.7° C./hr for a period of 10 hours, and an interruption step, in which the temperature was increased by 3° C. within one minute of completion of the preceeding growth step. The single crystallization ratio was 50%.

EXAMPLE 6

(The Accelerative Crystallization Method)

Single crystalline GaAs was produced by means of the growth apparatus show in FIG. 3. The growth apparatus was, however, different from that shown in FIG. 3 regarding the fact that the boat 14 had a diameter of 50 mm and a length of 380 mm.

Crystal growth by means of the accelerative crystallization method was carried out as follows.

Polycrystalline GaAs in an amount of 1500 grams was charged into the boat 14 and then 0.2 gram of chromium was added to the polycrystalline GaAs. A seed crystal of GaAs having a <111> As orientation was located at the end of the boat 14 on the lefthand side. The arsenic 12 was heated to and kept at 610° C. At the beginning of crystal growth, the temperature profile was controlled by means of the four heating zones 15 so that: the position of the seed crystal of GaAs was 1230° C. and the end of the boat 14 opposite to the seed crystal of GaAs was 1280° C. When the above-mentioned temperature profile was formed in the electric furnace 20, the temperature of the electric furnace was decrease by means of the following program while maintaining the temperature gradient in the longitudinal direction of the furnace.

| Period of Time Since Beginning of Crystal Growth | Rate of Decrease in Temperature |
| --- | --- |
| 0~3 hours | 3.00° C./hr |
| 3~6 hours | 2.00° C./hr |
| 6~17 hours | 0.91° C./hr |
| 17~25 hours | 0.63° C./hr |
| 25~35 hours | 0.50° C./hr |
| 35~70 hours | 0.45° C./hr |

Thirty-four percent and 58% of the total melt crystallized at the 10% time and 30% time, respectively.

The etch pit density (EPD) of the resultant single crystalline GaAs was $6.1 \times 10^3/cm^3$ in a portion of the crystal 120 mm from the seed crystal of GaAs. The single crystallization ratio was 60%, and the resistivity varied from $2 \times 10^8$ to $4 \times 10^8 \Omega$-cm in the ingot, i.e. the GaAs rod consisting of single crystalline and polycrystalline portions, along the whole length of the ingot.

The above-described crystal growth was repeated three times in an attempt to detect the formation of twins. However no twins were detected.

EXAMPLE 7

(The Accelerative Crystallization Method)

The procedure of Example 1 was repeated except that the following program of temperature decrease was employed.

| Period of Time Since Beginning of the Crystal Growth | Rate of Decrease in Temperature |
| --- | --- |
| 0~4 hours | 1.50° C./hr |
| 4~10 hours | 1.33° C./hr |
| 10~22 hours | 0.83° C./hr |
| 22~34 hours | 0.54° C./hr |
| 34~78 hours | 0.45° C./hr |

Twenty-three percent and 52% of the total melt crystallized at the 10% time and 30% time, respectively.

The single crystallization ratio of the resultant GaAs ingot was 55%, the EPD at a distance of 120mm from the seed crystal was $6.4 \times 10^3/cm^3$, and the resistivity along the whole length of the ingot varied from $1.5 \times 10^8$ to $3 \times 10^8 \Omega$-cm.

EXAMPLE 8

(The Accelerative Crystallization Method)

The procedure of Example 6 was repeated except that the HB method was carried out by means of an electric furnace having three heating zones 15 which generated the following temperature profile: 1250° C. at the highest temperature part, 1215° C. at the medium temperature parts, and 610° C. at the lowest temperature part and a temperature gradient of 7° C./cm between the highest and medium temperature parts. The boat 14, which was contained in the ampoule 11, was located, at the beginning of crystal growth, so that the arsenic 12, the seed crystal (not shown), and the polycrystalline GaAs were positioned at the lowest, medium, and highest temperature parts, respectively. At the beginning of crystal growth, the electric furnace was displaced according to the following program.

| Period of Time Since Beginning of Crystal Growth | Displacing Rate of Furnace |
| --- | --- |
| 0~4 hours | 20 mm/hr |
| 4~10 hours | 15 mm/hr |
| 10~20 hours | 7 mm/hr |
| 20~30 hours | 5 mm/hr |
| 30~70 hours | 2.3 mm/hr |

Thirty-three percent and 14% of the total melt crystallized at the 10% time and the 30% time, respectively.

The single crystallization ratio of the resultant GaAs ingot was 53%, the EPD at a distance of 120 mm from the seed crystal was $6.2 \times 10^3/cm^3$, and the resistivity along the whole length of the ingot varied from $2 \times 10^8$ to $5 \times 10^8 \Omega$-cm.

EXAMPLE 9

(A Comparative Example of the Accelerative Crystallization Method)

The procedure of Example 1 was repeated except that the rate of decrease in temperature was at a constant value of 0.5° C./hour. The total growth time was 95 hours, the single crystallization ratio was 38%, and the resistivity at a distance of 68 mm from the seed crystal was less than $10^6 \Omega$-cm. During the three repeated crystal growth processes, twins were formed in two of the processes.

EXAMPLE 10

(Combination of the Interruption Method and Accelerative Crystallization Method)

The procedure of Example 6 was repeated except that during a period of from 25 to 35 hours the decrease in temperature was interrupted for 3 hours. The single crystallization ratio was 65%.

I claim:

1. A method for producing a single crystal of a III$_b$-V$_b$ group compound by solidifying a melt of the III$_b$-V$_b$ compound contained in a boat, in which a single crystal seed of the III$_b$-V$_b$ compound is placed, comprising:
   (a) providing a furnace having a temperature gradient;
   (b) placing the boat containing the III$_b$-V$_b$ compound in the furnace with the seed of the III$_b$-V$_b$ compound at a point in the furnace within the lower temperature range, of the temperature gradient, and forming a melt of the III$_b$-V$_b$ compound;
   (c) displacing said furnace relative to the boat from the seed, along the boat to grow the crystal;
   (d) completing the crystallization at a time when said solid-liquid interface arrives at the end of the boat opposite the seed crystal; and
   (e) effecting the furnace displacement in step (c) so that from 40% to 65% of the total melt is crystallized at the time when 30% of the time for completing the crystallization has elapsed.

2. A method according to claim 1, wherein the percentage of the melt has crystallized at the time at when 10% of the total time required for completing crystallization has elapsed is controlled, so that the degree of crystallization at said 10% of the total time is from 20 to 40%.

3. A method of claim 1 for producing a single crystal of a III$_b$-V$_b$ group compound wherein the crystallization is interrupted at least once during the crystallization period.

4. A method for producing a single crystal of a III$_b$-V$_b$ group compound by solidifying a melt of the III$_b$-V$_b$ compound contained in a boat, in which a single crystal seed of the III$_b$-V$_b$ compound is placed, comprising:
   (a) providing a furnace having a temperature gradient;
   (b) placing the boat containing the III$_b$-V$_b$ compound into the furnace with the seed of the III$_b$-V$_b$ compound at a point in the furnace within the lower temperature range, of the temperature gradient, and forming a melt of the III$_b$-V$_b$ compound;
   (c) decreasing the temperature in the furnace to displace a solid-liquid interface of the III$_b$-V$_b$ compound, from the seed along the boat to grow the crystal;
   (d) completing the crystallization at a time when said solid-liquid interface arrives at the end of the grow the crystal;
   (d) completing the crystallization at a time when said solid-liquid interface arrives at the end of the boat opposite the seed crystal; and
   (e) effecting the furnace displacement in step (c) so that from 40% to 65% of the total melt is crystallized at the time when 30% of the time for completing the crystallization has elapsed.

* * * * *